(12) United States Patent
Terao et al.

(10) Patent No.: US 8,299,458 B2
(45) Date of Patent: Oct. 30, 2012

(54) ORGANIC ELECTROLUMINESCENT DEVICE

(75) Inventors: Yutaka Terao, Matsumoto (JP); Naoyuki Kanai, Matsumoto (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 12/673,735

(22) PCT Filed: Oct. 31, 2008

(86) PCT No.: PCT/JP2008/069969
§ 371 (c)(1),
(2), (4) Date: Feb. 14, 2011

(87) PCT Pub. No.: WO2009/069434
PCT Pub. Date: Jun. 4, 2009

(65) Prior Publication Data
US 2011/0233525 A1 Sep. 29, 2011

(30) Foreign Application Priority Data

Nov. 28, 2007 (JP) ................................ 2007-307583

(51) Int. Cl.
*H01L 51/30* (2006.01)

(52) U.S. Cl. ............. 257/40; 257/E51.01; 257/E51.013; 257/E51.015; 257/E51.017; 257/E51.018

(58) Field of Classification Search .................... 257/40, 257/E51.01, E51.013, E51.015, E51.017, 257/E51.018
See application file for complete search history.

(56) References Cited

U.S. PATENT DOCUMENTS

| 2001/0046611 | A1 | 11/2001 | Kido et al. | |
|---|---|---|---|---|
| 2004/0062949 | A1 | 4/2004 | Pfeiffer et al. | |
| 2006/0051615 | A1 | 3/2006 | Kanno et al. | |
| 2007/0285010 | A1* | 12/2007 | Lee et al. | 313/504 |
| 2008/0268282 | A1* | 10/2008 | Spindler et al. | 428/690 |

FOREIGN PATENT DOCUMENTS

| JP | 04-297076 A | 10/1992 |
|---|---|---|
| JP | 05-326146 A | 12/1993 |
| JP | 06-314594 A | 11/1994 |
| JP | 09-194487 A | 7/1997 |
| JP | 11-251067 A | 9/1999 |

(Continued)

OTHER PUBLICATIONS

Office Action issued in corresponding Chinese Patent Application No. 2008801067410 dated Apr. 1, 2011. Partial English translation provided.

(Continued)

*Primary Examiner* — Minchul Yang
(74) *Attorney, Agent, or Firm* — Rossi, Kimms & McDowell LLP

(57) ABSTRACT

An organic EL device is provided with a hole injection layer, a hole transport layer, a light-emitting layer, an electron transport layer and an electron injection layer between an anode and a cathode, wherein the hole injection layer is obtained by doping a hole transport material with an electron-accepting impurity, and the ionization potential Ip(HIL) of the material of the hole injection layer that composes the hole injection layer (also referred to as a hole injection material in the present description), the ionization potential Ip(HTL) of the hole transport material, and the ionization potential Ip(EML) of the material of the light-emitting layer (also referred to as a light-emitting layer material in the present description) respectively satisfy the relationship of $Ip(EML) > Ip(HTL) \geq Ip(HIL) \geq Ip(EML) - 0.4$ eV.

6 Claims, 5 Drawing Sheets

FOREIGN PATENT DOCUMENTS

| | | |
|---|---|---|
| JP | 2004-002740 A | 1/2004 |
| JP | 2004-514257 A | 5/2004 |
| JP | 2005-026210 A | 1/2005 |
| JP | 2006-049394 A | 2/2006 |
| JP | 2006-066872 A | 3/2006 |
| JP | 2006-253251 A | 9/2006 |
| JP | 2006-351398 A | 12/2006 |
| JP | 2007-179933 A | 7/2007 |
| JP | 2007-191465 A | 8/2007 |
| WO | 2006/085615 A1 | 8/2006 |

OTHER PUBLICATIONS

International Search Report issued in related PCT/JP2008/069969, mailed Jan. 13, 2009.

Pfeiffer, M. et al., "Doped organic semiconductors: Physics and application in light emitting diodes," Organic Electronics, vol. 4, Issue 2-3, Sep. 2003, pp. 89-103.

Kido, Junji et al.,"Bright organic electroluminescent devices having a metal-doped electron-injecting layer," Applied Physics Letters, vol. 73, No. 20,Nov. 16, 1998, pp. 2866-2868.

Shigeki, Naka et al., "High electron mobility in bathophenanthroline," Applied Physics Letters, vol. 76, No. 2, Jan. 10, 2000, pp. 197-199.

Hideyuki, Murata et al., "Efficient organic light-emitting diodes with undoped active layers based on silole derivates," Applied Physics Letters, vol. 80, No. 2, Jan. 14, 2002, pp. 189-191.

* cited by examiner

ORGANIC ELECTROLUMINESCENT DEVICE

BACKGROUND

The present invention relates to an organic electroluminescent device that can be applied to a flat panel display or illumination light source. More particularly, the present invention relates to an organic electroluminescent device that operates at a low driving voltage and has low power consumption.

Research towards practical use of organic electroluminescent devices (hereinafter also referred to as organic EL devices) has been conducted actively in recent years. Since organic EL devices are able to realize high current density at low voltage, they are expected to be able to realize high emission luminance and luminous efficiency. These organic EL devices are provided with a first electrode and a second electrode surrounding an organic EL layer, and the electrode on the side on which light is extracted is required to have high transmittance. Normally transparent conductive oxide (TCO) materials (such as indium tin oxide (ITO), indium zinc oxide (IZO) or indium-tungsten oxide (IWO)) are used for these electrode materials. Since these materials have a comparatively large work function of up to 5 eV, they are used as hole injection electrodes (anodes) of organic materials.

Light emitted by organic EL devices is obtained as a result of light being released accompanying relaxation of the excitation energy of excitons generated by holes injected into the highest occupied molecular orbital (HOMO, generally measured as ionization potential) of a light-emitting layer material, and electrons injected into the lowest unoccupied molecular orbital (LUMO, generally measured as electron affinity). In general, organic EL devices employ a laminated structure having a light-emitting layer in addition to all or a portion of a hole injection layer, a hole transport layer, an electron transport layer and an electron injection layer in order to efficiently carry out hole injection and electron injection into the light-emitting layer.

In recent years, methods for lowering the voltage and power consumption of organic EL devices employing this type of laminated structure for organic EL devices have attempted to improve effective charge mobility and lower the charge injection barrier from an electrode by doping charge transport layers other than the light-emitting layer with impurities, and a technology has been disclosed for lowering the driving voltage of these devices (Japanese Patent Application Laid-open No. H4-297076; Japanese Patent Application Laid-open No. H11-251067; Japanese Translation of PCT Application No. 2004-514257; Organic Electronics, Vol. 4, Issues 2-3 (September 2003), p. 89; Applied Physics Letters, Vol. 73, Issue 20 (November 1998), p. 2866).

This technology is similar to the p-type doping and n-type doping technology employed in inorganic semiconductors. For example, in the case of a hole injection layer or hole transport layer, by mixing an impurity in the form of a material having high electron acceptability (acceptor) into the material of the hole transport layer that composes them (to also be referred to as a hole transport material in the present description), the hole injection barrier from an electrode (difference between the work function of the anode and the HOMO level of the adjacent hole transport material) can be lowered, or the effective carrier mobility of the hole transport layer can be improved. In the case of an electron injection layer or electron transport layer, by mixing an impurity in the form of a material having a high electron-donating ability (donor) into the material of the electron transport layer (also referred to as an electron transport material in the present description), the electron injection barrier from an electrode (difference between the work function of the cathode and the LUMO level of the adjacent electron transport material) can be lowered, or the effective mobility of the electron transport material can be improved.

On the other hand, phenanthroline derivatives and silole derivatives have been reported to be electron transport materials having even higher electron mobility (See, for example, Applied Physics Letters, Vol. 76, Issue 2 (January 2000), p. 197; Applied Physics Letters, Vol. 80, Issue 2 (January 2002), p. 189), and by using these materials in an electron transport layer, driving voltage can be reduced considerably for electron injection layers and electron transport layers without having to use n-type doping techniques.

However, as a result of promoting injection of electrons into a light-emitting layer by using an electron transport material like that described above, the hole-electron recombination region ends up being extremely biased toward the anode side, namely the hole transport layer/light-emitting layer interface, and although this allows current to flow at a lower voltage, there are cases in which luminous efficiency decreases remarkably. This phenomenon is particularly remarkable when the host of the light-emitting layer does not have a dominantly high hole transport ability in terms of its charge transport properties.

In cases in which the supply of electrons to the light-emitting layer has become excessive in this manner, by using a hole transport material having electron affinity sufficiently smaller than (0.15 eV or more) the electron affinity of the light-emitting layer for the hole transport layer in contact with the light-emitting layer, electrons are blocked at the hole transport layer/light-emitting layer interface, and as a result of being trapped within the light-emitting layer, improve luminous efficiency. This technology is disclosed in Japanese Patent Application Laid-open No. 2005-26210.

In addition, a technology for preventing deterioration of luminous efficiency or emission lifetime is disclosed in Japanese Patent Application Laid-open No. 2006-66872 that prevents excessive supply of electrons to a light-emitting layer by providing an electron limiting layer that limits the movement of electrons together with an electron transport layer that promotes transport of electrons between the light-emitting layer and the cathode.

In addition, Japanese Patent Application Laid-open No. H6-314594 discloses a technology for providing an organic EL device that lowers device driving voltage and has superior durability by providing a plurality of carrier injection layers.

The technology disclosed in Japanese Patent Application Laid-open No. 2005-26210 was unable to sufficiently prevent a decrease in luminous efficiency of the device while also impairing emission lifetime. This is thought to be due to deterioration of the hole transport material as a result of numerous electrons reaching the hole transport layer/light-emitting layer interface.

Although use of the technology disclosed in Japanese Patent Application Laid-open No. 2006-66872 certainly makes it possible to prevent deterioration of luminous efficiency or emission lifetime, as a result of limiting movement of electrons, the effect of reducing voltage is diminished, thereby preventing the inherent effect of reducing voltage from being adequately obtained.

SUMMARY OF THE INVENTION

In order to solve the above-mentioned problems, an object of the present invention is to provide an organic EL device that has low driving voltage and high luminous efficiency.

The present invention relates to an organic EL device provided with a hole injection layer, a hole transport layer, a light-emitting layer, an electron transport layer and an electron injection layer between an anode and a cathode, wherein the hole injection layer is obtained by doping a hole transport material with an electron-accepting impurity, and the ionization potential Ip(HIL) of the material of the hole injection layer that composes the hole injection layer (also referred to as a hole injection material in the present description), the ionization potential Ip(HTL) of the hole transport material, and the ionization potential Ip(EML) of the material of the light-emitting layer (also referred to as a light-emitting layer material in the present description) respectively satisfy the relationship of Ip(EML)>Ip(HTL)≧Ip(HIL)≧Ip(EML)−0.4 eV.

According to the present invention, injection of holes into a light-emitting layer can be improved that matches the improvement of injection of electrons into the light-emitting layer, thereby making it possible to significantly lower driving voltage while maintaining or improving luminous efficiency of an organic EL device, while also enabling power consumption of the organic EL device to be reduced.

BRIEF DESCRIPTION OF THE DRAWINGS

The invention will be described with reference to certain preferred embodiments thereof and the accompanying drawings.

DETAILED DESCRIPTION OF THE PREFERRED EMBODIMENTS

The present invention is based on the finding that, typically when an electron transport material having a superior ability to inject electrons into a light-emitting layer is used for an electron transport layer, the driving voltage of an organic EL device can be reduced considerably while maintaining or improving luminous efficiency by improving the ability to inject holes into the light-emitting layer.

In the present description, "superior ability to inject electrons" refers to the distribution of the formation of excitation in the light-emitting layer being biased toward the hole transport layer (HTL)/light-emitting layer (EML) interface at any voltage or any current when a voltage is applied or a current flows to an organic EL device.

The following provides an explanation of the present invention with reference to the drawings.

Figure 1:
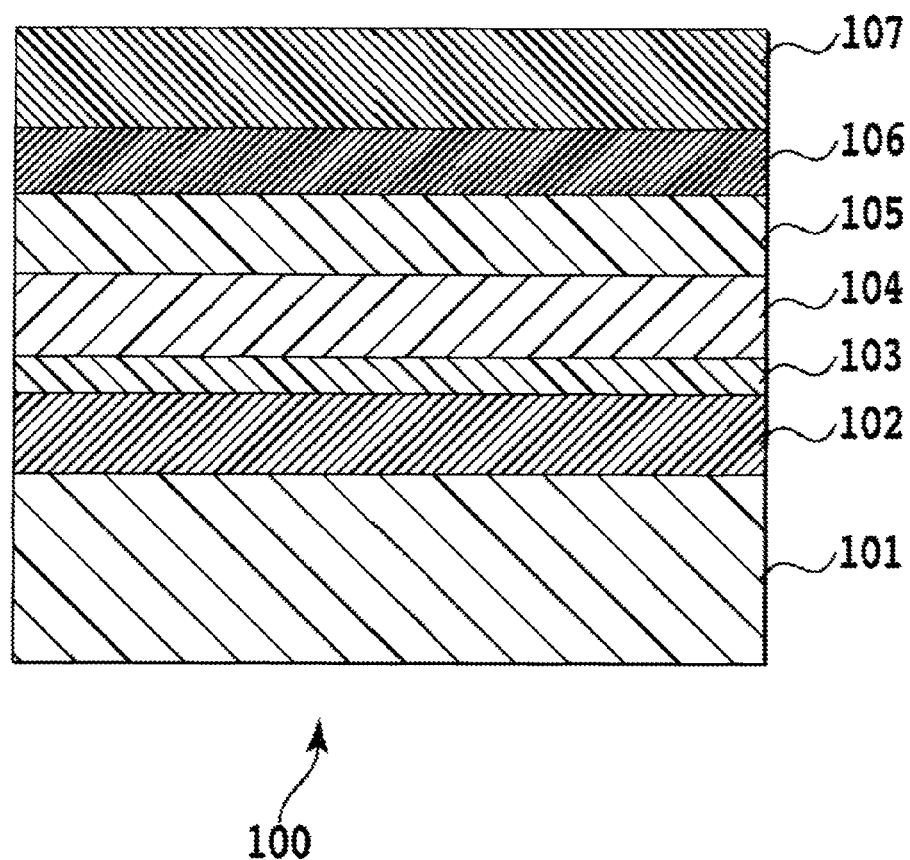
FIG. 1 is a schematic diagram showing an organic EL device of the present invention.

An example of the configuration of an organic EL device 100 of the present invention is shown in FIG. 1. The drawing shows an organic EL device having a laminated structure obtained by sequentially laminating an anode 102, a hole injection layer (HIL) 103, a hole transport layer (HTL) 104, a light-emitting layer (EML) 105, an electron transport layer (ETL) 106 and a cathode 107 on a substrate 101, and the configuration of each layer is similar to that of the prior art. In a different aspect of an organic EL device according to the present invention, a device structure is employed in which the order of the layers is the reverse of that shown in FIG. 1. In this case, each layer is laminated on the substrate in the order of a cathode, electron transport layer, light-emitting layer, hole transport layer, hole injection layer and anode.

The anode, cathode, hole injection layer, hole transport layer and electron transport layer shown in FIG. 1 constitute basic constituents, and an electron injection layer (EIL) can be inserted between the cathode and the electron transport layer to promote injection of electrons from the cathode into the electron transport layer. The insertion of an electron injection layer is more preferable in terms of lowering the driving voltage of the device.

The anode, the cathode or both preferably transmit light to enable light emitted from the organic EL device to be extracted outside the device. The order in which each layer of the organic EL device is laminated as well as which electrode is given the ability to transmit light can be selected according to the application of the organic EL device.

Figure 2:
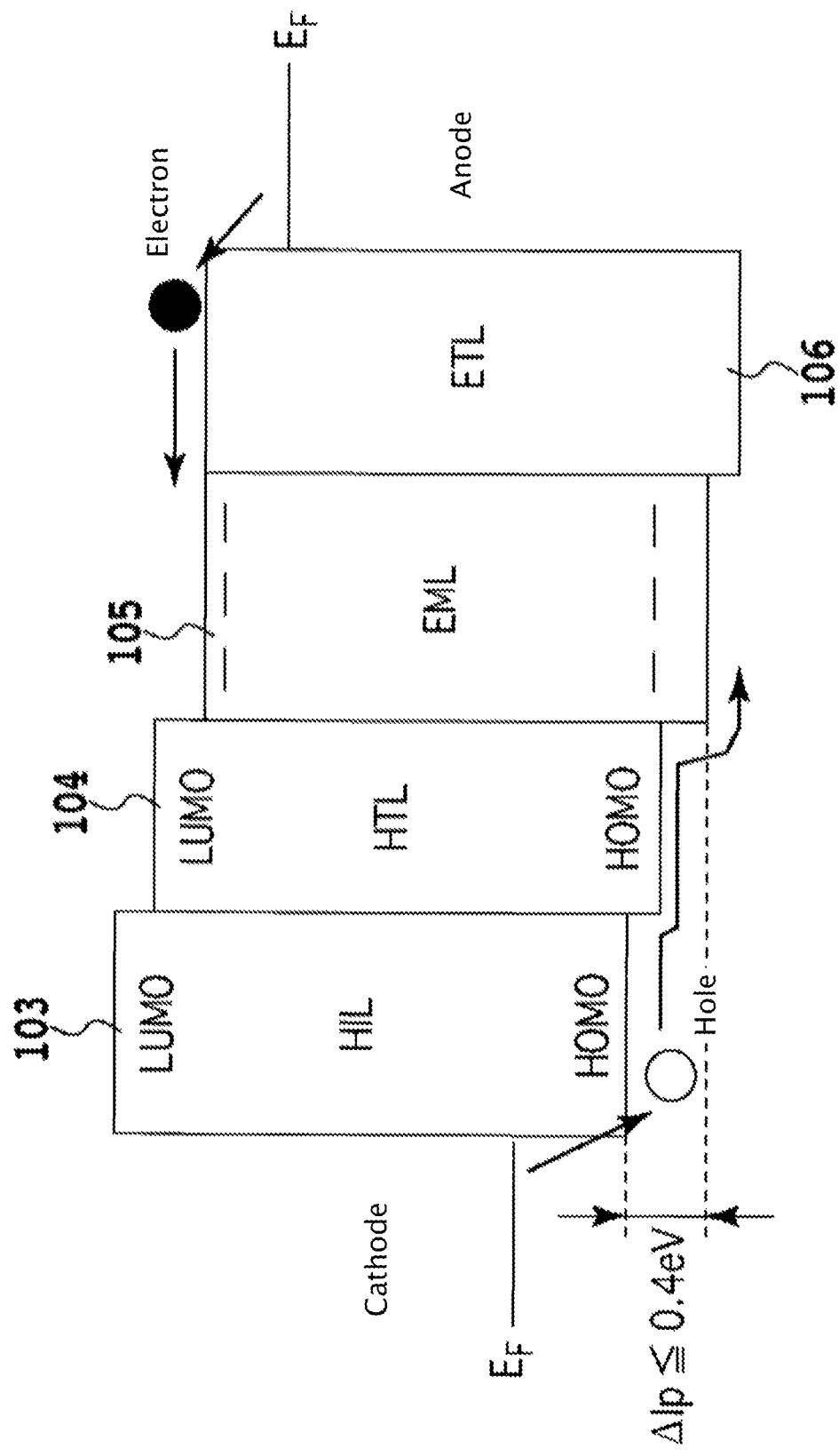
FIG. 2 is a schematic diagram showing the energy levels of an organic EL device of the present invention.
Figure 3:
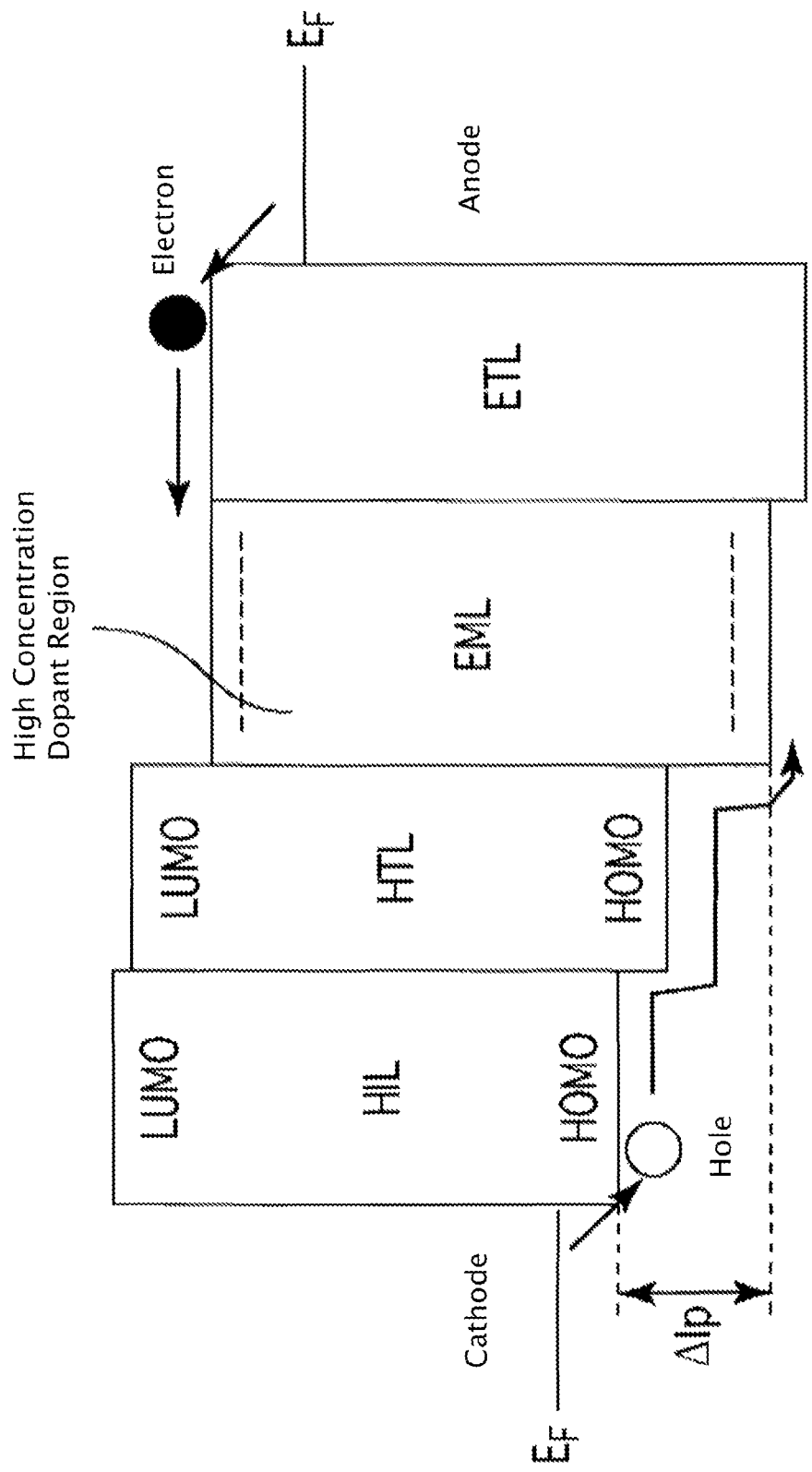
FIG. 3 is a schematic diagram showing the energy levels of an organic EL device of the prior art.

FIG. 2 shows an energy band diagram of the organic EL device of the present invention shown in FIG. 1. In addition, FIG. 3 shows a typical energy band diagram of an organic EL device according to the prior art. In the prior art, when providing the hole injection layer (HIL) 103 between the anode 102 and the hole transport layer 104, a hole injection material and hole transport material were typically selected so as to form a stepwise potential barrier at the interface of each layer from the Fermi level ($E_F$) of the anode to the HOMO level of the light-emitting layer to enable hole injection and hole transport from the anode 102 to be carried out more effectively.

The organic EL device of the present invention is characterized in that, instead of simply forming a hole potential barrier in a stepwise manner from the anode 102 to the light-emitting layer 105, each material is selected so that the difference ΔIp between the ionization potential of the light-emitting layer material and the ionization potential of hole injection material is 0.4 eV or less, and so that the difference between the ionization potentials of the light-emitting layer material and the hole transport material is also 0.4 eV or less as shown in FIG. 2.

Furthermore, although ultraviolet photoelectron spectroscopy (UPS) and the like is used to measure ionization potential (Ip), the present invention is not limited thereto, in the present invention, ionization potential (Ip) is evaluated based on the results of measurement using the Atmospheric Pressure Photoelectron Spectrometer AC-2 (Riken Keiki Co., Ltd.) unless specifically stated otherwise.

Figure 4:
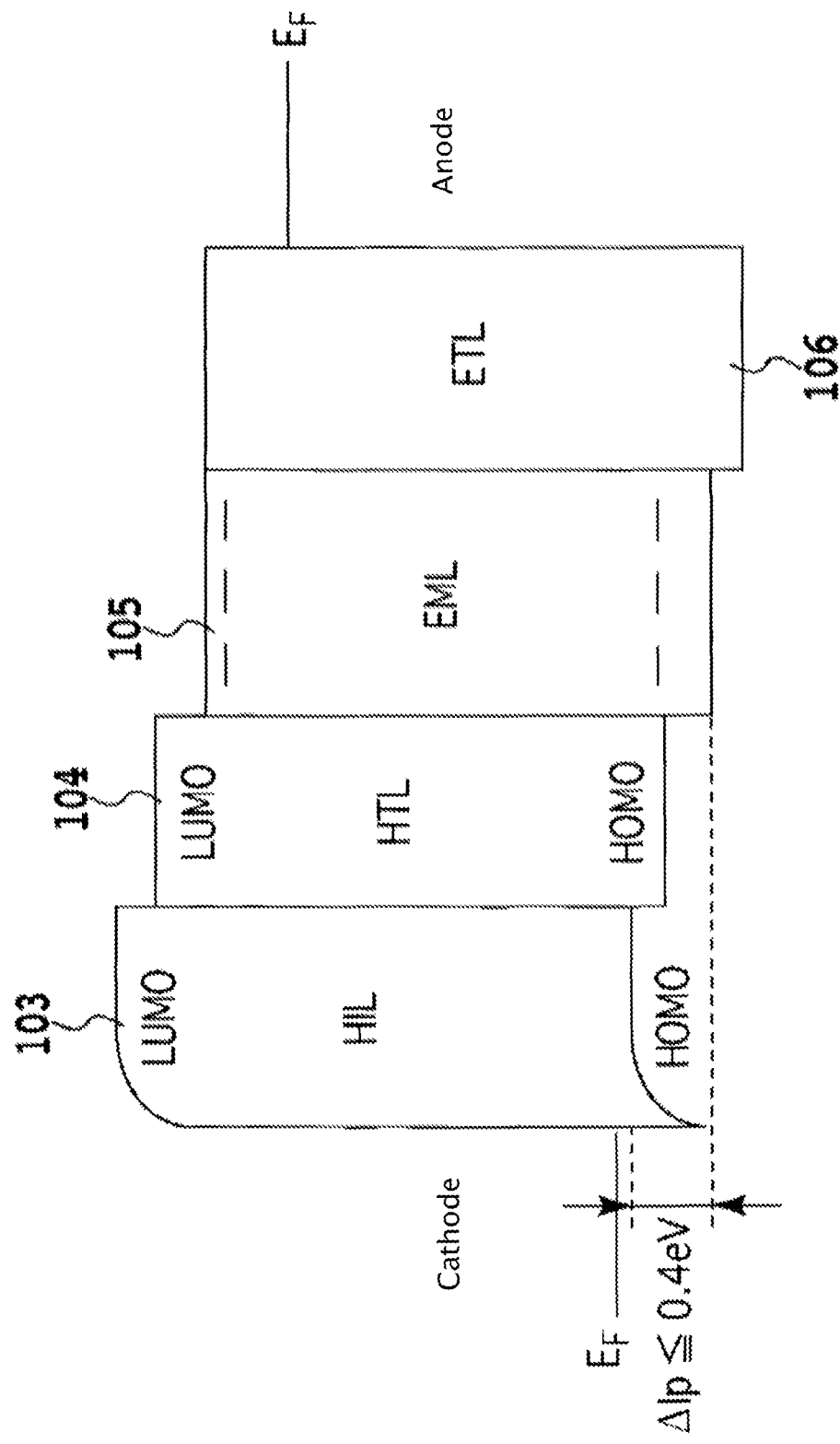
FIG. 4 is a schematic diagram showing the energy levels of an organic EL device of a different aspect of the present invention.

FIG. 4 shows an energy band diagram for the organic EL device of a different aspect of the organic EL device according to the present invention when an acceptor dopant has been added to the hole injection layer. In this case, as a result of adding an acceptor dopant to the hole injection layer, a large band curve is formed at the anode/hole injection layer interface, the HOMO level of the bulk region of the hole injection layer rises and approaches the Fermi level of the anode, thereby improving the injection of holes from the anode to the hole injection layer. Moreover, by making the difference in ionization potentials between the light-emitting layer material and the hole injection material and the difference in ionization potentials between light-emitting layer material and hole transport material 0.4 eV or less each, injection holes into the light-emitting layer is improved, thereby enhancing device performance.

In the present invention, the electron affinity X(A) of the acceptor dopant added to the hole injection layer is preferably such that X(A)≧Ip(HIL)−0.3 eV. This is because it is necessary to accept electrons from the HOMO level of the host material, namely the hole injection material, in order for the added impurity to adequately function as an acceptor, and consequently, electron acceptance level of the acceptor dopant in the form of the LUMO level is preferably equal to or less than the HOMO level of the hole injection material. In addition, although inverse photoelectron spectroscopy (IPES) and the like is strictly used to measure electron affinity X(A), in the present invention, electron affinity X(A) is evaluated based on an alternative value that is calculated using an optical band gap determined from the absorption edge as determined by measurement of optical absorption, and the ionization potential as measured with the above-mentioned AC-2, unless specifically stated otherwise.

In addition, in the present invention, the optical band gap Eg(HTL) of the hole transport layer relative to the optical band gap Eg(EML) of the light-emitting layer is preferably such that Eg(HTL)>Eg(EML). This is because, if these optical band gaps are made to be such that Eg(HTL)>Eg(EML), holes and electrons recombine in the light-emitting layer, and the energy of the excitons formed makes it difficult for them to move into hole transport layer adjacent to the light-emitting layer, thereby making it possible to inhibit decreases in luminous efficiency. Although an ultraviolet-visible spectrophotometer is typically used to measure optical band gap Eg, in the present invention, optical band gap Eg is evaluated based on the results of measuring using the Shimadzu Ultraviolet-Visible Spectrophotometer UV-2100PC unless specifically stated otherwise.

As will be indicated later, improvement of injection of holes from the anode to the hole injection layer by adding an acceptor dopant to the hole injection layer alone does not yield an improvement in injection of holes into the light-emitting layer to an extent that improves device performance.

The following provides a detailed explanation of each layer.

Anode

As was previously described, the anode used in the present invention may transmit light or reflect light. In the case of transmitting light, the anode can be formed by using a commonly known transparent conductive oxide material, such as indium tin oxide (ITO), indium zinc oxide (IZO), indium-tungsten oxide (IWO) or Al-doped zinc oxide (AZO). In addition, a highly conductive polymer material such as poly (3,4-ethylenedioxythiophene): poly(styrenesulfonate) (PEDOT:PSS) can also be used for the anode.

A laminated structure consisting of a thin (about nm) metal material and the previously described transparent conductive film can be employed for the anode in order to reduce electrical resistance of the anode wiring and control reflectance or transmittance.

When forming a light-reflecting anode, a high reflectance metal, an amorphous alloy or microcrystalline alloy, or a laminate thereof in combination with the previously described transparent conductive film, can be used. Examples of metals having high reflectance include Al, Ag, Ta, Zn, Mo, W, Ni and Cr. Examples of high reflectance amorphous alloys include NiP, NiB, CrP and CrB. Examples of high reflectance microcrystalline alloys include NiAl and silver alloys.

Transparent conductive oxides, high reflectance metals and amorphous alloys or microcrystalline alloys can be formed using any arbitrary method known in the related art, such as deposition or sputtering.

A conductive polymer material such as PEDOT:PSS can be formed using any arbitrary method known in the related art, such as spin coating, ink jetting or printing.

Hole Injection Layer

Examples of materials that can be used for the hole injection layer of the organic EL device of the present invention include hole transport materials typically used in organic EL devices or organic TFT devices, such as materials having a triarylamine partial structure, carbazole partial structure or oxadiazole partial structure.

Specific examples of these materials include N,N'-diphenyl-N,N'-bis(3-methylphenyl)-1,1'-biphenyl-4,4'-diamine (TPD), N,N,N',N'-tetrakis(4-methoxyphenyl)-benzidine (MeO-TPD), 4,4',4"-tris{1-naphthyl(phenyl)amino}triphenylamine (1-TNATA), 4,4',4"-tris{2-naphthyl(phenyl)amino}triphenylamine (2-TNATA), 4',4"-tris(3-methylphenylphenylamino)triphenylamine (m-MTDATA), 4,4'-bis{N-(1-naphthyl)-N-phenylamino}biphenyl (NPB), 2,2',7, 7'-tetrakis(N,N-diphenylamino)-9,9'-spirobifluorene (Spiro-TAD), N,N'-di(biphenyl-4-yl)-N,N'-diphenyl-(1,1'-biphenyl)-4,4'-diamine (p-BPD), tri(o-terphenyl-4-yl)amine (o-TTA), tri(p-terphenyl-4-yl)amine (p-TTA), 1,3,5-tris[4-(3-methylphenylphenylamino)phenyl]benzene (m-MTDAPB) and 4,4',4"-tris-9-carbazolyltriphenylamine (TCTA).

However, material selection is limited in order to make the difference between the Ip of the light-emitting layer material and the Ip of the hole injection material 0.4 eV or less. For example, in the case of using 9,10-di(2-naphthyl)anthracene (ADN) (Ip=5.8 eV) for the light-emitting layer host, the aforementioned materials of the hole injection layer that can be used consist of NPB (Ip=5.4 eV), Spiro-TAD (Ip=5.4 eV), p-TTA (Ip=5.5 eV), m-MTDAPB (Ip=5.7 eV) and TCTA (Ip=5.7 eV). In addition to these ordinary materials, there are also materials that can be used for the hole transport layer that are commercially available from various organic electronic material manufacturers.

In addition, an electron-accepting dopant may also be added (p-type doping) to the hole injection layer. Examples of electron-accepting dopants that can be used include organic derivatives such as tetracyanoquinodimethane derivatives, a specific example of which is 2,3,5,6-tetrafluoro-7,7,8,8-tetracyanoquinodimethane ($F_4$-TCNQ). In addition, inorganic derivatives such as molybdenum oxide ($MoO_3$), tungsten oxide ($WO_3$) or vanadium oxide ($V_2O_5$) can also be used.

Hole Transport Layer

Any arbitrary material selected from known materials used for hole transport materials of organic EL devices or organic TFT as previously indicated for the hole injection layer can be selected for the material of the hole transport layer of the organic EL device of the present invention. However, similar to the case of the hole injection material, selection of the material is limited in order to make the difference between the Ip of the light-emitting layer material and the Ip of the hole injection material 0.4 eV or less.

More specifically, similar to the case of the hole injection material, examples of materials that can be used include Spiro-TAD, NPB, p-TTA, m-MTDAPB and TCTA in the case of using ADN for the light-emitting layer host material.

Light-Emitting Layer

The material of the light-emitting layer can be selected corresponding to the desired color tone. For example, in order to emit light of a blue to blue-green color, a fluorescent whitening agent such as a benzthiazole-based, benzimidazole-based or benzoxazole-based agent, a styrylbenzene-based compound or an aromatic dimethylidene-based compound can be used. Specific examples of these materials include the aforementioned ADN, 4,4'-bis(2,2'-diphenylvinyl)biphenyl (DPVBi), 2-methyl-9,10-di(2-naphthyl)anthracene (MADN), 9,10-bis-(9,9-bis(n-propyl) fluoren-2-yl)

anthracene (ADF) and 9-(2-naphthyl)-10-(9,9-bis(n-propyl) fluoren-2-yl)anthracene (ANF).

The light-emitting layer may also be doped with a fluorescent pigment. The fluorescent pigment material used for the dopant can be selected corresponding to the desired color tone. More specifically, examples of the fluorescent pigment material consist of conventionally known materials including condensed ring derivatives such as perylene or rubrene, quinacridone derivatives, phenoxazone 660, dicyanomethylene derivatives such as 4-(dicyanomethylene)-2-methyl-6-(p-dimethylaminostyryl)-4H-pyran (DCM), 4-(dicyanomethylene)-6-methyl-2-[2-(julolidin-9-yl)ethyl]-4H-pyran (DCM2), 4-(dicyanomethylene)-2-methyl-6-(1,1,7,7-tetramethyljulolidyl-9-enyl)-4H-pyran (DCJT) or 4-(diaminomethylene)-2-t-butyl-6-(1,1,7,7-tetramethyljulolidyl-9-enyl)-4H-pyran (DCJTB), perynone, coumarin derivatives, pyrromethane derivatives and cyanine pigments.

In addition, a plurality of light-emitting dopants can also be added to the same light-emitting layer material in order to adjust the color tone of the emitted color.

Electron Transport Layer

The present invention is effective in the case of using a conventional, widely used material having superior electron transportability, such as aluminum tris(8-quinolinolate) ($Alq_3$), for the material of the electron transport layer (also referred to as an electron transport material in the present description).

Specific examples of such electron transport materials include triazole derivatives such as 3-phenyl-4-(1'-naphthyl)-5-phenyl-1,2,4-triazole (TAZ); oxadiazole derivatives such as 1,3-bis[(4-t-biphenylyl)-1,3,4-oxadiazole]phenylene (OXD-7), 2-(4-biphenyl)-5-(4-t-butylphenyl)-1,3,4-oxadiazolyl(PBD) or 1,3,5-tris(4-t-butylphenyl-1,3,4-oxadiazole) benzene (TPOB); and thiophene derivatives such as 5,5'-bis (dimesitylboryl)-2,2'-bithiophene (BMB-2T) or 5,5'-bis (dimesitylboryl)-2,2':5'2'-terthiophene (BMB-3T). More preferable examples include a 1,10-phenanthroline having the molecular structure shown in formula (1), or derivatives thereof, and a silole derivative having the molecular structure shown in formula (2).

[C1]

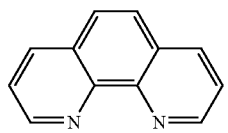

(1)

[C2]

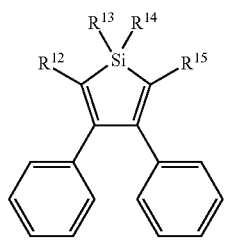

(2)

In formula (2), $R^{12}$ to $R^{15}$ may be the same or different, and represent a hydrogen atom, halogen atom, aliphatic substituent such as an alkyl group, such as a methyl, ethyl, propyl or butyl group, or a substituted alkyl group, or an aromatic substituent such as an unsubstituted or substituted phenyl group or unsubstituted or substituted pyridyl group.

Specific examples of such materials include 4,7-diphenyl-1,10-phenanthroline (BPhen), 2,9-dimethyl-4,7-diphenyl-1,10-phenanthroline (BCP), 2,5-di-(3-biphenyl)-1,1-dimethyl-3,4-diphenylsilacyclopentadiene (PPSPP), 1,2-bis(1-methyl-2,3,4,5-tetraphenylsilacyclopentadienyl)ethane (2PSP) and 2,5-bis(2,2-bipyridin-6-yl)-1,1-dimethyl-3,4-diphenylsilacyclopentadiene (PyPySPyPy).

Electron Injection Layer

An electron injection layer composed of an insulator and a semiconductor can be provided between the cathode and the electron transport layer or between the cathode and the light-emitting layer in the organic EL device of the present invention. The providing of such an electron injection layer serves to improve injection of electrons from the cathode to the electron transport layer or the light-emitting layer.

In general, examples of materials that can be used for the material of the electron injection layer (also referred to as an electron injection material in the present description) include alkaline metal calcogenides such as $Li_2O$, LiO, $Na_2S$, $Na_2Se$ or NaO, alkaline earth metal calcogenides such as CaO, BaO, SrO, BeO, BaS or CaSe, alkaline metal halides such as LiF, NaF, KF, CsF, LiCl, KCl or NaCl, alkaline earth metal halides such as $CaF_2$, $BaF_2$, $SrF_2$, $MgF_2$ or $BeF_2$, and alkaline metal carbonates such as $Cs_2CO_3$.

In addition, a film doped with an impurity in the form of an alkaline metal such as Li, Na, K or Cs, an alkaline metal halide such as LiF, NaF, KF or CsF, or an alkaline metal carbonate such as $Cs_2CO_3$ among the electron transport materials can be used as an electron injection layer that promotes injection of electrons from the cathode.

Cathode

A metal, alloy, electroconductive compound and mixtures thereof having a small work function (4.0 eV or less) is preferably used in the form of an electrode substance for the cathode. Specific examples include sodium, sodium-potassium alloys, magnesium, lithium, magnesium-silver alloys, aluminum/aluminum oxide, aluminum-lithium alloys, indium and rare earth metals.

The cathode can be produced by forming these cathode substances into a thin film using a method such as deposition or sputtering.

In the case of extracting light from the light-emitting layer from the cathode side, light transmission can be improved by using a cathode in the form of a laminate structure with a transparent conductive oxide material mediated by the aforementioned metals, alloys and cathode materials.

Each layer that composes the organic EL layer as described above can be formed using any arbitrary means known in the related art, such as deposition (resistance heating or electron beam heating).

The following provides a detailed explanation of the present invention through examples thereof.

Example 1

An IZO film was deposited on a glass substrate (50 mm long×50 mm wide×0.7 mm thick, Corning, 1737 glass) by DC Magnetron sputtering (target: $In_2O_3$+10 wt % ZnO, discharge gas: Ar+0.5% $O_2$, discharge pressure: 0.3 Pa, discharge power: 1.45 W/cm², substrate transport speed: 162 mm/min). This IZO film was then processed into the shape of stripes having a width of 2 mm by photolithography to form an IZO electrode having a film thickness of 110 nm and a width of 2 mm.

Next, a hole injection layer to which had been added an electron-accepting dopant was deposited on the IZO electrode. The deposition procedure consisted of simultaneously heating NPB and $F_4$-TCNQ by resistance heating vapor deposition and simultaneously depositing using a vapor deposition rate for the $F_4$-TCNQ of 0.02 Å/s versus a vapor deposition rate for the NPB of 1 Å/s to deposit a hole injection layer composed of an $F_4$-TCNQ-doped NBP film at a thickness of 80 nm.

Continuing, TCTA was deposited to a thickness of 10 nm at the rate of 1 Å/s by resistance heating vapor deposition to serve as a hole transport layer. Next, a light-emitting layer, using ADN for the host of the light-emitting layer material and 4,4'-bis(2-(4-N,N-diphenylamino)phenyl)vinyl)biphenyl (DPAVBi) for the dopant of the light-emitting layer, was deposited to a thickness of 25 nm at a vapor deposition rate of 1 Å/s for the ADN and a vapor deposition rate of 0.03 Å/s for the DPAVBi. Next, an electron transport layer in the form of BCP was deposited to a thickness of 20 nm at a vapor deposition rate of 1 Å/s.

Moreover, an electron injection layer composed of LiF was vapor-deposited to a thickness of 1 nm on the electron transport layer at a vapor deposition rate of 0.2 Å/s, and an anode in the form of Al was formed to a thickness of 100 nm at a rate of 2 Å/s on the electron injection layer through a metal mask in which a slit was formed having a width of 2 mm.

Each of the steps following deposition of the hole injection layer were carried out consistently without breaking the vacuum using resistance heating vapor deposition.

Continuing, a sample was transferred to a dry box that had been replaced with nitrogen gas, an epoxy-based adhesive was applied near the four sides of a sealing glass plate (OA-10, 41 mm long×41 mm wide×1.1 mm thick, Nippon Electric Glass Co., Ltd.), and the sealing glass was affixed to the sample so as to cover the organic EL layer to obtain a blue organic EL device of Example 1. The sample was prevented from contacting the atmosphere when transferred to the dry box following cathode formation.

Example 2

A blue organic EL device was produced in the same manner as Example 1 with the exception of using a material in which p-TTA was doped with $F_4$-TCNQ for the material of the hole injection layer. At this time, the vapor deposition rate of the p-TTA was 1 Å/s and the vapor deposition rate of the $F_4$-TCNQ was 0.02 Å/s.

Example 3

A blue organic EL device was produced in the same manner as Example 1 with the exception of using NPB for the material of the hole transport layer.

Example 4

A blue organic EL device was produced in the same manner as Example 1 with the exception of using p-TTA for the material of the hole transport layer.

Example 5

A blue organic EL device was produced in the same manner as Example 1 with the exception of using a material in which p-TTA was doped with $F_4$-TCNQ for the material of the hole injection layer, and using p-TTA for the material of the hole transport layer.

Comparative Example 1

A blue organic EL device was produced in the same manner as Example 1 with the exception using a material in which 2-TNATA was doped with $F_4$-TCNQ for the material of the hole injection layer.

Comparative Example 2

A blue organic EL device was produced in the same manner as Example 1 with the exception of using a material in which 2-TNANA was doped with $F_4$-TCNQ for the material of the hole injection layer, and using NPB for the hole transport material.

Comparative Example 3

An organic EL device was produced in the same manner as Comparative Example 2 with the exception of using $Alq_3$ for the material of the electron transport layer.

Figure 5:
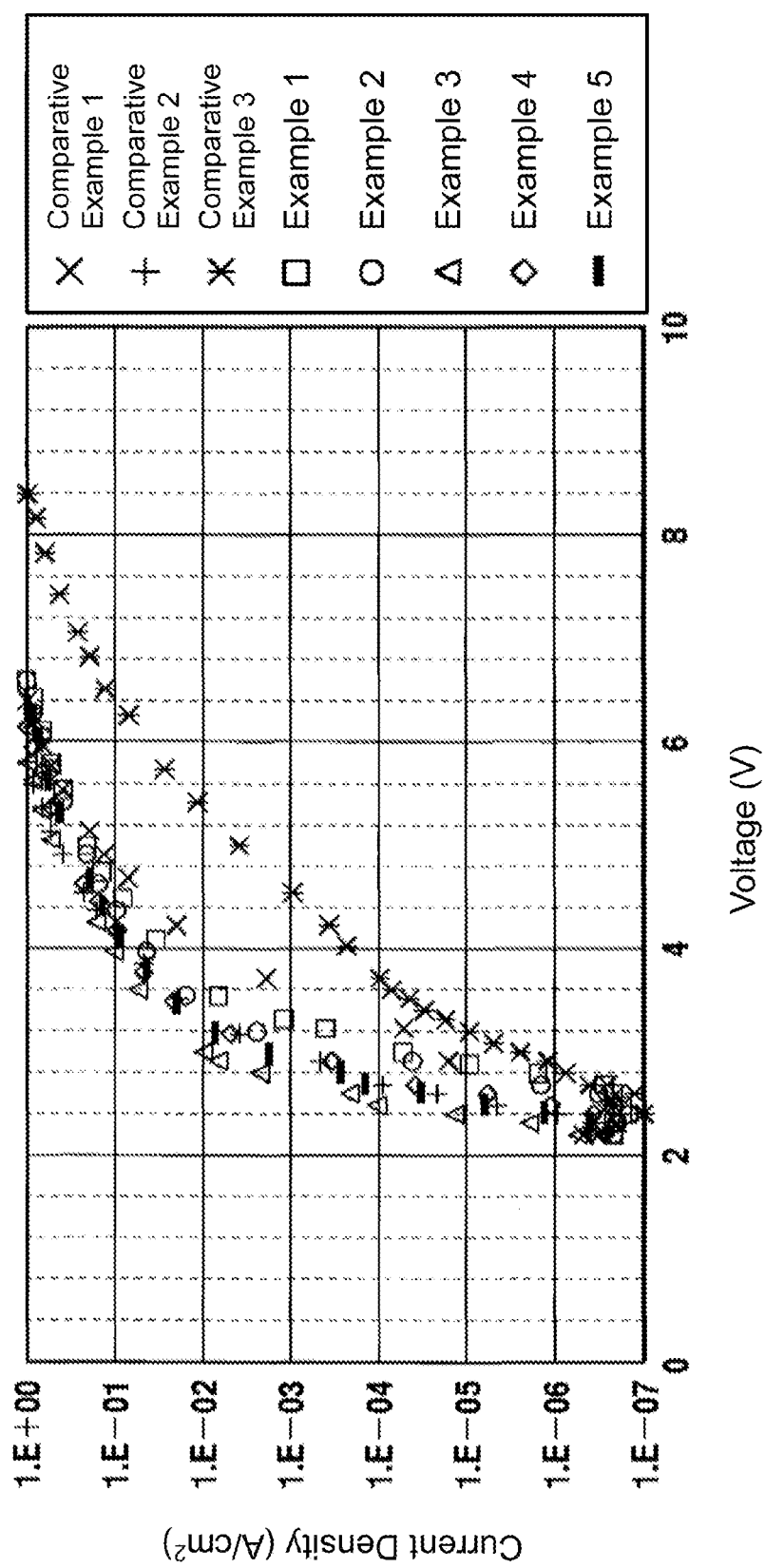
FIG. 5 is a drawing showing current vs. voltage characteristics of organic EL devices according to the present invention.

The current vs. voltage characteristics of each of the organic EL devices obtained in the above-mentioned examples and comparative examples are shown in FIG. 5. In addition, current efficiencies when the current density was 10 $mA/cm^2$ and 1 $A/cm^2$ are summarized in Table 1.

TABLE 1

| 1. Current Efficiencies of EL Devices (unit: cd/A) | | |
|---|---|---|
| | 10 mA/cm² | 1 A/cm² |
| Comparative Example 1 | 5.2 | 4.3 |
| Comparative Example 2 | 8.6 | 7.0 |
| Comparative Example 3 | 12.5 | 9.8 |
| Example 1 | 10.3 | 8.7 |
| Example 2 | 15.7 | 11.1 |
| Example 3 | 14.9 | 10.4 |
| Example 4 | 10.9 | 10.3 |
| Example 5 | 10.8 | 9.6 |

The device of Comparative Example 3 uses a material commonly used in the prior art in the form of $Alq_3$ for the material of the electron transport layer. The device of Comparative Example 2 replaces the material of the electron transport layer of Comparative Example 3 with BCP, which demonstrates superior injection of electrons in the light-emitting layer. According to FIG. 5, although it was possible to lower the voltage by about 2 V during a current density of 10 $mA/cm^2$ as a result of changing the electron transport layer, as can be understood from Table 1, this device ends up exhibiting a considerable decrease in current efficiency, thereby offsetting the effect of lowered voltage.

In the devices of Examples 1 to 5, an equivalent voltage reduction of ±0.3 V was achieved at voltage of 10 $mA/cm^2$ in comparison with Comparative Example 2, and as shown in Table 1, there were no significant decreases in current efficiency observed. Namely, in the case of using an electron transport material having a superior ability to inject electrons into the light-emitting layer for the electron transport layer, driving voltage of the device was shown to be able to be reduced without lowering current efficiency.

On the other hand, the device of Comparative Example 1 lowers the hole transport barrier at the hole transport layer/light-emitting layer interface by replacing the electron transport material of Comparative Example 3 with BCP and using the TCTA used in Example 1 for the hole transport material, and was produced using the same hole injection layer as that used in Comparative Example 3. In the case of this Comparative Example 1, the effect of lowered voltage decreased as a result of using BCP for the electron transport material, particularly in comparison with Comparative Example 2, in a current range of 1 mA/cm$^2$ to 100 mA/cm$^2$ as shown in FIG. 5. In addition, current efficiency ended up decreasing further as shown in Table 1.

As has been described above, in the case of using an electron transport material having a superior ability to inject electrons into the light-emitting layer, the organic EL device of the present invention was shown to allow a reduction in voltage without lowering the luminous efficiency of the device.

The invention has been described with reference to certain preferred embodiments thereof. Modifications and variations, however, are possible within the scope of the appended claims.

The invention claimed is:

1. An organic EL device provided with at least a hole injection layer, a hole transport layer, a light-emitting layer and an electron transport layer between an anode and a cathode, wherein:
    an ionization potential Ip(HIL) of material of the hole injection layer, an ionization potential Ip(HTL) of material of the hole transport layer, and an ionization potential Ip(EML) of material of the light-emitting layer respectively satisfy the relationship of Ip(EML)>Ip(HTL)≧Ip(HIL)≧Ip(EML)−0.4 eV, and
wherein an acceptor dopant is added to the hole injection layer, and an electron affinity X(A) of the acceptor dopant added to the hole injection layer is represented by: X(A)≧Ip(HIL)−0.3 eV.

2. The organic EL device according to claim 1, wherein the material of the hole injection layer is the same as the material of the hole transport layer.

3. The organic EL device according to claim 1, wherein an optical band gap Eg(HTL) of the hole transport layer relative to the optical band gap Eg(EML) of the light-emitting layer is represented by: Eg(HTL)>Eg(EML).

4. The organic EL device according to claim 1, wherein the electron transport layer contains a phenanthroline compound.

5. The organic EL device according to claim 1, wherein the electron transport layer contains 1,10-phenanthroline, having the molecular structure shown in formula (1), or a derivative thereof

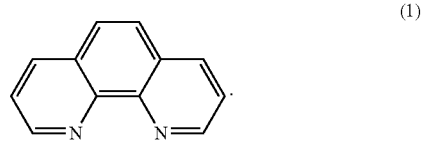

(1)

6. The organic EL device according to claim 1, wherein the electron transport layer contains a silole derivative having the molecular structure shown in formula (2):

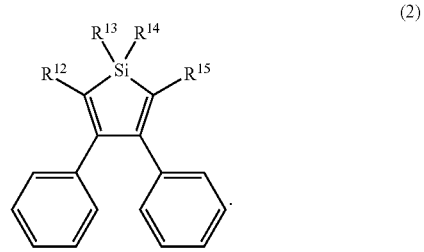

(2)

(where, R$^{12}$ to R$^{15}$ are the same or different, and represent a hydrogen atom, halogen atom, aliphatic substituent or an aromatic substituent).

* * * * *